United States Patent
He

(10) Patent No.: US 11,575,360 B1
(45) Date of Patent: Feb. 7, 2023

(54) ELECTRODE STRUCTURE OF BULK ACOUSTIC RESONATOR WITH EDGE AIR GAP AND FABRICATION METHOD THEREOF

(71) Applicant: Newsonic Technologies, Shenzhen (CN)

(72) Inventor: Xudong He, Shenzhen (CN)

(73) Assignee: Newsonic Technologies, Shenzhen (CN)

( * ) Notice: Subject to any disclaimer, the term of this patent is extended or adjusted under 35 U.S.C. 154(b) by 0 days.

(21) Appl. No.: 17/699,383

(22) Filed: Mar. 21, 2022

(51) Int. Cl.
*H03H 9/02* (2006.01)
*H03H 9/13* (2006.01)
*H03H 9/17* (2006.01)
*H03H 3/02* (2006.01)

(52) U.S. Cl.
CPC .............. *H03H 9/132* (2013.01); *H03H 3/02* (2013.01); *H03H 9/02031* (2013.01); *H03H 9/176* (2013.01)

(58) Field of Classification Search
CPC ..... H03H 9/132; H03H 9/02031; H03H 9/176
See application file for complete search history.

(56) References Cited

U.S. PATENT DOCUMENTS

| | | | | |
|---|---|---|---|---|
| 2007/0279152 | A1* | 12/2007 | Kawamura | H03H 3/04 333/187 |
| 2012/0194297 | A1* | 8/2012 | Choy | H03H 9/02149 310/365 |
| 2015/0318837 | A1* | 11/2015 | Zou | H03H 9/02086 333/187 |
| 2018/0152168 | A1* | 5/2018 | Han | H03H 9/17 |
| 2019/0036511 | A1* | 1/2019 | Choy | H03H 9/132 |
| 2019/0058451 | A1* | 2/2019 | Lee | H03H 9/175 |

\* cited by examiner

*Primary Examiner* — Bryan P Gordon
(74) *Attorney, Agent, or Firm* — Bayramoglu Law Offices LLC

(57) ABSTRACT

An electrode structure of a resonator and a fabrication method for the electrode structure of the resonator are provided. The electrode structure includes a piezoelectric layer. An electrode metal layer, a dielectric layer, a protrusion/frame metal layer and an etching passivation layer are sequentially arranged above the piezoelectric layer. An air gap is formed between the dielectric layer and the protrusion/frame metal layer, and the air gap is located at an electrode edge. Through the air gap between the dielectric layer and the protrusion/frame metal layer above the piezoelectric layer, an electrode protrusion/frame structure of the resonator with an edge air gap is formed, which serves as an electrode part. When the resonator is working, through the air gap, a transverse sound wave can be reflected back to the resonator and be bound in a resonator body. This greatly increases the Q factor and working performance of the resonator.

13 Claims, 3 Drawing Sheets

ELECTRODE STRUCTURE OF BULK ACOUSTIC RESONATOR WITH EDGE AIR GAP AND FABRICATION METHOD THEREOF

TECHNICAL FIELD

The present invention relates to the technical field of bulk acoustic resonators (BARs), and more particularly, to an electrode structure of a bulk acoustic resonator with an edge air gap and a fabrication method thereof.

BACKGROUND

The bulk acoustic resonator (BAR)/filter involves longitudinal and transverse sound waves in operation. The transverse sound wave needs to be bound within the resonator body to achieve a high Q factor, so as to achieve desirable working performance.

In the prior design, a protrusion structure (or called a frame structure) with a certain width is provided at an electrode edge of the BAR to help reflect the transverse sound wave back to the resonator. As shown in FIG. 1, the electrode metal layer 1010 is provided on the piezoelectric layer 1000, the protrusion/frame metal layer 1020 is provided at the edge of the electrode metal layer 1010, and the passivation layer 1030 is covered on the electrode metal layer 1010 and the edge protrusion/frame.

The prior design has the problem of limited reflected transverse sound wave. Therefore, it is desirable to develop a structure or method to effectively reflect the transverse sound wave back to the resonator.

SUMMARY

The present invention provides an electrode structure of a bulk acoustic resonator with an air gap and a fabrication method thereof. The present invention improves an electrode edge frame structure to better reflect a transverse sound wave and improve a Q factor and performance of a resonator.

The present invention provides an electrode structure of a resonator, including:

a piezoelectric layer, where an electrode metal layer, a dielectric layer, a protrusion/frame metal layer and an etching passivation layer are sequentially arranged above the piezoelectric layer;

where, an air gap is formed between the dielectric layer and the protrusion/frame metal layer, and the air gap is located at an electrode edge.

Preferably, the side of the protrusion/frame metal layer adjacent to the dielectric layer may be provided with a protrusion structure that protrudes upwardly, and an air gap may be formed between the protrusion structure and the dielectric layer.

Preferably, the electrode structure further may include: a conductive metal lead; and the conductive metal lead may be located on a side of the protrusion/frame metal layer away from the dielectric layer.

Preferably, an end of the etching passivation layer away from the air gap may be provided with a conductive hole, and a conductive metal lead may be provided in the conductive hole and extend outward; and the conductive metal lead may be electrically connected to the electrode metal layer and the protrusion/frame metal layer, respectively.

The present invention further provides a fabrication method of an electrode structure of a resonator, which is suitable for the above electrode structure of the resonator, and includes the following steps:

step 1: depositing a top electrode metal layer and a dielectric layer on a piezoelectric layer in sequence;

step 2: forming an electrode edge sacrificial layer of the resonator for pattern etching above the electrode metal layer;

step 3: depositing a protrusion/frame metal layer above the electrode metal layer and on the electrode edge sacrificial layer;

step 4: performing pattern etching on the protrusion/frame metal layer at the electrode edge until the dielectric layer;

step 5: depositing a passivation layer on a surface of the protrusion/frame metal layer;

step 6: performing pattern etching on one side of the passivation layer, the protrusion/frame metal layer, the electrode edge sacrificial layer, the dielectric layer and the electrode metal layer at the electrode edge in sequence to form a structure of a top electrode of a film bulk acoustic resonator (FBAR);

step 7: performing pattern etching on the other side of the passivation layer and the dielectric layer to form a conductive hole of the top electrode of the FBAR;

step 8: forming a conductive metal lead of the top electrode of the FBAR, where the conductive metal lead is electrically connected to the electrode metal layer and the protrusion/frame metal layer, respectively; and step 9: release-etching the electrode edge sacrificial layer to form an air gap.

Preferably, in step 1, the dielectric layer may include but may not be limited to one or a stack of a plurality of silicon nitride (SiN), aluminum nitride (AlN), silicon oxide (SiO$_2$) and silicon oxynitride (SiNO);

the electrode metal layer may be made of a metal material or a conductive metal material;

the metal material or the conductive metal material may include but may not be limited to one or a stack of a plurality of molybdenum (Mo), aluminum (Al), copper (Cu), platinum (Pt), tantalum (Ta), tungsten (W), palladium (Pd) and ruthenium (Ru);

the piezoelectric layer may be made of a piezoelectric material, and the piezoelectric material may include but may not be limited to one or a stack of a plurality of aluminum nitride (AlN), zinc oxide (ZnO), lithium niobate (LiNbO$_3$), lithium tantalate (LiTaO$_3$), lead zirconate titanate (PZT) and barium strontium titanate (BST);

in step 2, the electrode edge sacrificial layer may be removed to form the air gap; and the electrode edge sacrificial layer may be formed above the electrode metal layer of the top electrode by a lift-off process or pattern etching;

in step 3, the protrusion/frame metal layer may be made of a conductive material; and in step 5, the etching passivation layer may include but may not be limited to one or a stack of a plurality of silicon nitride (SiN), aluminum nitride (AlN), silicon oxide (SiO$_2$) and silicon oxynitride (SiNO).

Preferably, when the piezoelectric material of the piezoelectric layer is aluminum nitride (AlN), the piezoelectric material may be further doped with a rare earth element; and the rare earth element may include but may not be limited to one or a combination of a plurality of scandium, erbium and lanthanum.

Preferably, in steps 4, 6 and 7, the pattern etching may be one or a combination of two of plasma etching and wet chemical etching.

Preferably, the conductive metal lead may define a circuit lead and a pad of the top electrode of the FBAR; and the conductive metal lead may be a metal material, and the conductive metal lead may be one or a stack of a plurality of aluminum (Al), copper (Cu), gold (Au), titanium (Ti), tungsten (W) and platinum (Pt).

Preferably, the electrode edge sacrificial layer may be made of silicon oxide (SiO$_2$); and in step 9, the release-etching process may be one or a combination of a plurality of hydrofluoric acid (HF) wet etching, buffered oxide etchant (BOE) wet etching and HF vapor etching.

The working principle and beneficial effects of the present invention are as follows:

The present invention provides an electrode structure of a resonator and a fabrication method thereof. The electrode structure includes: a piezoelectric layer, where an electrode metal layer, a dielectric layer, a protrusion/frame metal layer and an etching passivation layer are sequentially arranged above the piezoelectric layer; and an air gap is formed between the dielectric layer and the protrusion/frame metal layer, and the air gap is located at an electrode edge.

In the present invention, through the air gap between the dielectric layer and the protrusion/frame metal layer above the piezoelectric layer, an electrode protrusion/frame structure of the resonator with an edge air gap is formed which serves as an electrode part. The electrode edge structure includes the electrode metal layer, the dielectric layer, the air gap, the protrusion/frame metal layer and the passivation layer in order from the piezoelectric layer to the outside.

Further, through the air gap formed between the dielectric layer and the protrusion/frame metal layer above the piezoelectric layer of the resonator, a transverse sound wave can be reflected back to the resonator and be bound in the resonator during the operation of the resonator. This greatly increases the Q factor of the resonator and further improves the working performance of the resonator.

Other features and advantages of the present invention will be illustrated in the following description, and some of these will become apparent from the description or be understood by implementing the present invention. The objectives and other advantages of the present invention may be implemented by the structure specifically indicated in the specification and drawings.

The technical solutions of the present invention will be further described in detail below with reference to drawings and embodiments.

BRIEF DESCRIPTION OF THE DRAWINGS

The drawings are provided for further understanding of the present invention and constitute a part of the specification. The drawings, together with the embodiments of the present invention, are intended to explain the present invention, rather than to limit the present invention. Drawings.

Figure 1:
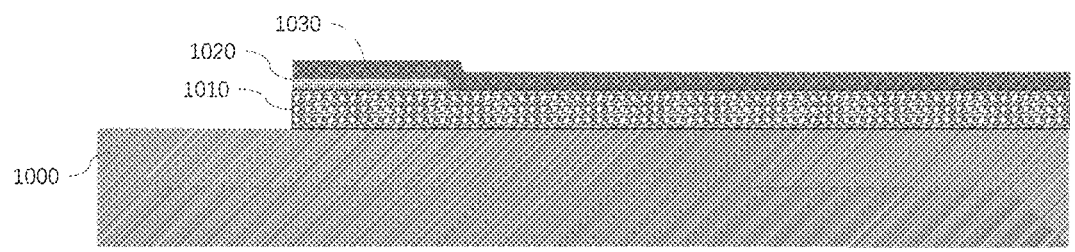
FIG. 1 is a structural view of an existing electrode structure of a resonator.

Reference Numerals: 100. piezoelectric layer; 110. dielectric layer; and 120. etching passivation layer;

200. electrode metal layer; 210. protrusion/frame metal layer; and 220. conductive metal lead;

300. air gap; 400. electrode edge sacrificial layer; and 500. conductive hole;

210a. top electrode protrusion/frame metal layer; 300a. top electrode air gap; 110a. top electrode dielectric layer; 200a. top electrode metal layer; 200b. bottom electrode metal layer; 210b. bottom electrode protrusion/frame metal layer; 300b. bottom electrode air gap; 110b. bottom electrode dielectric layer; and 120b. etching passivation layer.

DETAILED DESCRIPTION OF THE EMBODIMENTS

The preferred embodiments of the present invention are described below with reference to the drawings. It should be understood that the preferred embodiments described herein are only used to illustrate the present invention, rather than to limit the present invention.

As shown in FIGS. 1 to 13, an embodiment of the present invention provides an electrode structure of a resonator, including:

a piezoelectric layer 100, where an electrode metal layer 200, a dielectric layer 110, a protrusion/frame metal layer 210 and an etching passivation layer 120 are sequentially arranged above the piezoelectric layer 100;

where, an air gap 300 is formed between the dielectric layer 110 and the protrusion/frame metal layer 210, and the air gap 300 is located at an electrode edge.

The side of the protrusion/frame metal layer 210 adjacent to the dielectric layer 100 is provided with a protrusion structure that protrudes upwardly, and an air gap 300 is formed between the protrusion structure and the dielectric layer 100.

The electrode structure further includes: a conductive metal lead 220, where the conductive metal lead 220 is located on a side of the protrusion/frame metal layer 210 away from the dielectric layer 110.

An end of the etching passivation layer 120 away from the air gap 300 is provided with a conductive hole 500, where a conductive metal lead 220 is provided in the conductive hole 500 and extends outward; and the conductive metal lead 220 is electrically connected to the electrode metal layer 200 and the protrusion/frame metal layer 210, respectively.

Figure 2:
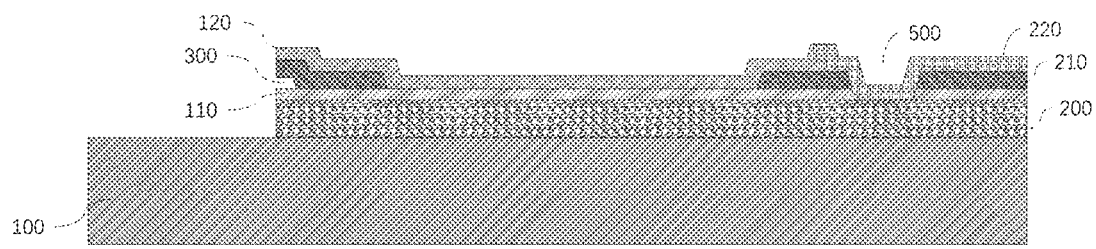
FIG. 2 is a structural view of an electrode structure for a fabrication method of a resonator according to the present invention.

In the present invention, as shown in FIG. 2, the electrode metal layer 200 is provided on the piezoelectric layer 100. The dielectric layer 110 is provided on the electrode metal layer 200. The protrusion/frame metal layer 210 is provided on the dielectric layer 110 at an edge of the electrode metal layer 200. A top electrode is provided above the piezoelectric layer 100. The etching passivation layer 120 is provided on the electrode metal layer 200 and the dielectric layer 110 of the top electrode. The air gap 300 is formed between the dielectric layer 110 at the edge of the top electrode and the protrusion/frame metal layer 210 at the edge. The conductive hole 500 is provided at one end of the etching passivation layer 120 and the dielectric layer 110 away from the air gap 300. The conductive metal lead 220 is provided at one end of the top electrode. The conductive metal lead 220 is electrically connected to the electrode metal layer 200 through the conductive hole 500, and it is also electrically connected to the protrusion/frame metal layer 210 at the edge of the electrode.

In the present invention, through the air gap between the dielectric layer and the protrusion/frame metal layer above the piezoelectric layer, an electrode protrusion/frame structure of the resonator with an edge air gap is formed, which serves as an electrode part. The electrode edge structure includes the electrode metal layer, the dielectric layer, the air gap, the protrusion/frame metal layer and the passivation layer in order from the piezoelectric layer to the outside.

Further, through the air gap formed between the dielectric layer and the protrusion/frame metal layer above the piezoelectric layer of the resonator, a transverse sound wave can be reflected back to the resonator and be bound in the resonator during the operation of the resonator. This greatly increases the Q factor of the resonator and further improves the working performance of the resonator.

The present invention further provides a fabrication method of an electrode structure of a resonator, which is suitable for the above electrode structure of the resonator, and includes the following steps:

Step 1: deposit a top electrode metal layer 200 and a dielectric layer 110 on a piezoelectric layer 100 in sequence.

Step 2: form an electrode edge sacrificial layer 400 of the resonator for pattern etching above the electrode metal layer 200.

Step 3: deposit a protrusion/frame metal layer 210 above the electrode metal layer 200 and on the electrode edge sacrificial layer 400.

Step 4: perform pattern etching on the protrusion/frame metal layer 210 at the electrode edge until the dielectric layer 110.

Step 5: deposit a passivation layer 120 on a surface of the protrusion/frame metal layer 210.

Step 6: perform pattern etching on one side of the passivation layer 120, the protrusion/frame metal layer 210, the electrode edge sacrificial layer 400, the dielectric layer 110 and the electrode metal layer 200 at the electrode edge in sequence to form a structure of a top electrode of a film bulk acoustic resonator (FBAR).

Step 7: perform pattern etching on the other side of the passivation layer 120 and the dielectric layer 110 to form a conductive hole 500 of the top electrode of the FBAR.

Step 8: form a conductive metal lead 220 of the top electrode of the FBAR, where the conductive metal lead 220 is electrically connected to the electrode metal layer 200 and the protrusion/frame metal layer 210, respectively.

Step 9: release-etch the electrode edge sacrificial layer 400 to form an air gap 300.

In Step 1, the dielectric layer 110 includes but is not limited to one or a stack of a plurality of silicon nitride (SiN), aluminum nitride (AlN), silicon oxide (SiO$_2$) and silicon oxynitride (SiNO);

the electrode metal layer 200 is made of a metal material or a conductive metal material;

the metal material or the conductive metal material includes but is not limited to one or a stack of a plurality of molybdenum (Mo), aluminum (Al), copper (Cu), platinum (Pt), tantalum (Ta), tungsten (W), palladium (Pd) and ruthenium (Ru);

the piezoelectric layer 100 is made of a piezoelectric material, and the piezoelectric material includes but is not limited to one or a stack of a plurality of aluminum nitride (AlN), zinc oxide (ZnO), lithium niobate (LiNbO$_3$), lithium tantalate (LiTaO$_3$), lead zirconate titanate (PZT) and barium strontium titanate (BST);

in Step 2, the electrode edge sacrificial layer 400 is removed to form the air gap 300; and the electrode edge sacrificial layer 400 is formed above the electrode metal layer 200 of the top electrode by a lift-off process or pattern etching;

in Step 3, the protrusion/frame metal layer 210 is made of a conductive material;

in Step 5, the etching passivation layer 120 includes but is not limited to one or a stack of a plurality of silicon nitride (SiN), aluminum nitride (AlN), silicon oxide (SiO$_2$) and silicon oxynitride (SiNO);

when the piezoelectric material of the piezoelectric layer 100 is aluminum nitride (AlN), the piezoelectric material is further doped with a rare earth element; and the rare earth element includes but is not limited to one or a combination of a plurality of scandium, erbium and lanthanum;

in Steps 4, 6 and 7, the pattern etching is one or a combination of two of plasma etching and wet chemical etching;

the conductive metal lead 220 defines a circuit lead and a pad of the top electrode of the FBAR;

the conductive metal lead 220 is made of a metal material, and the metal material includes one or a stack of a plurality of aluminum (Al), copper (Cu), gold (Au), titanium (Ti), tungsten (W) and platinum (Pt); and the electrode edge sacrificial layer 400 is made of silicon oxide (SiO$_2$); and in step 9, the release-etching process is one or a combination of a plurality of hydrofluoric acid (HF) wet etching, buffered oxide etchant (BOE) wet etching and HF vapor etching.

In the present invention, through the air gap between the dielectric layer and the protrusion/frame metal layer above the piezoelectric layer, an electrode protrusion/frame structure of the resonator with an edge air gap is formed, which serves as an electrode part. The electrode edge structure includes the electrode metal layer, the dielectric layer, the air gap, the protrusion/frame metal layer and the passivation layer in order from the piezoelectric layer to the outside.

Figure 13:
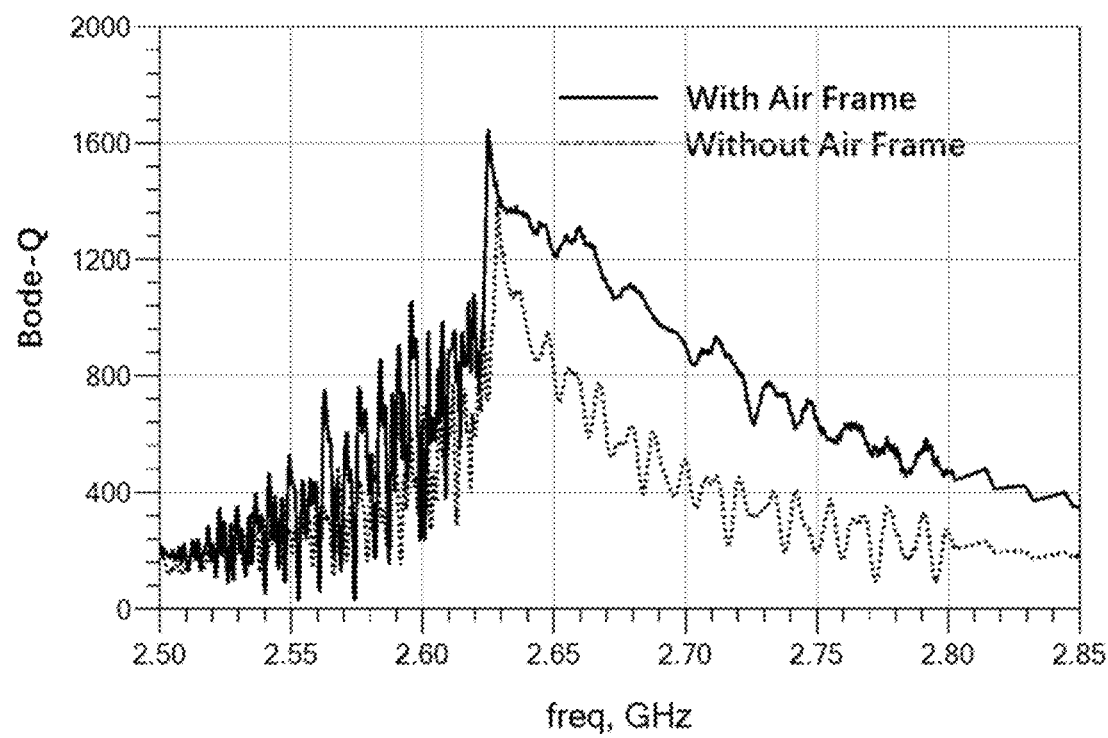
FIG. 13 shows a Q factor test result of the resonator according to the present invention.

A performance test result of the resonator in FIG. 13 shows that the Q factor of the resonator fabricated by the present invention is greatly improved. Further, through the air gap formed between the dielectric layer and the protrusion/frame metal layer above the piezoelectric layer of the resonator, a transverse sound wave can be reflected back to the resonator and be bound in the resonator during the operation of the resonator. This greatly increases the Q factor of the resonator and further improves the working performance of the resonator.

In the embodiment, the top electrode of the resonator is formed to have an air gap through the above steps. A bottom electrode may also be formed to have an air gap as needed; and alternatively, the top electrode and the bottom electrode may be formed simultaneously to have air gaps. For details, refer to the following embodiments.

Embodiment 1

Figure 3:
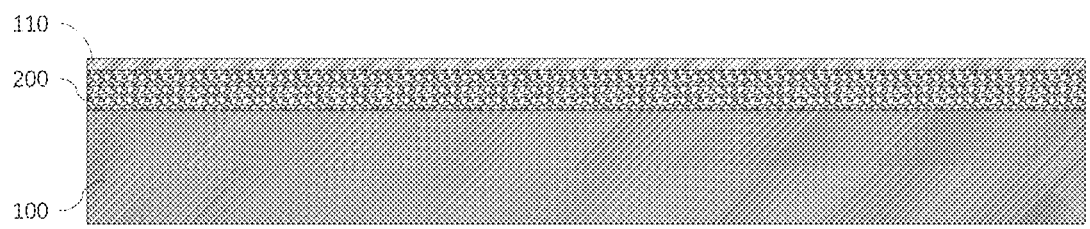
FIG. 3 is a structural view for step 1 of a fabrication method of an electrode structure of a resonator according to the present invention.

This embodiment provides a fabrication method of a resonator with an air gap structure in a top electrode, which is suitable for an electrode structure of a resonator, and includes the following steps:

Step 1, as shown in FIG. 3, a top electrode metal layer 200a and a top electrode dielectric layer 110a are deposited on a piezoelectric layer 100a. The piezoelectric layer 100 may be made of silicon nitride (SiN), aluminum nitride (AlN), silicon oxide ($SiO_2$) and silicon oxynitride (SiNO), or a stack thereof.

The top electrode metal layer 200a may be made of any suitable conductive metal material, for example, molybdenum (Mo), aluminum (Al), copper (Cu), platinum (Pt), tantalum (Ta), tungsten (W), palladium (Pd) and ruthenium (Ru), or a stack thereof. In this embodiment, it is made of molybdenum (Mo).

The piezoelectric layer 100 may be made of a piezoelectric material, for example, aluminum nitride (AlN), zinc oxide (ZnO), lithium niobate ($LiNbO_3$), lithium tantalate ($LiTaO_3$), lead zirconate titanate (PZT) and barium strontium titanate (BST), or a stack thereof.

When the piezoelectric layer 100 is made of aluminum nitride (AlN), the aluminum nitride may further be doped with a certain ratio of rare earth element (for example, scandium, erbium, lanthanum, etc.).

In this embodiment, the piezoelectric layer 100 is made of aluminum nitride (AlN) or scandium doped aluminum nitride (SLAlN).

Figure 4:
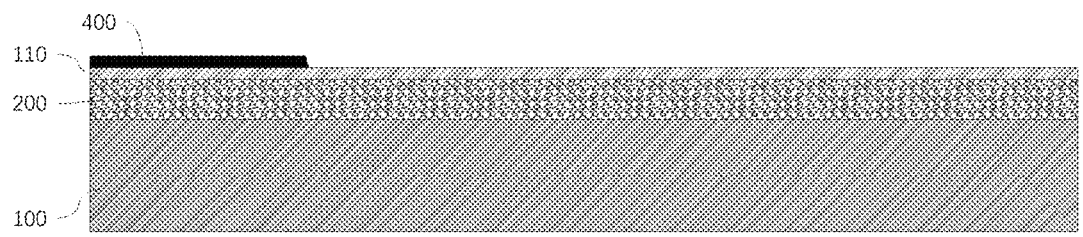
FIG. 4 is a structural view for step 2 of a fabrication method of an electrode structure of a resonator according to the present invention.

Step 2, as shown in FIG. 4, during the fabrication of the top electrode, an electrode edge sacrificial layer 400 of the resonator for pattern etching is formed above the top electrode metal layer 200a. The electrode edge sacrificial layer 400 is removed in a subsequence process to form a top electrode air gap 300a. The electrode edge sacrificial layer 400 for pattern etching may be formed through a lift-off process or pattern etching.

Figure 5:
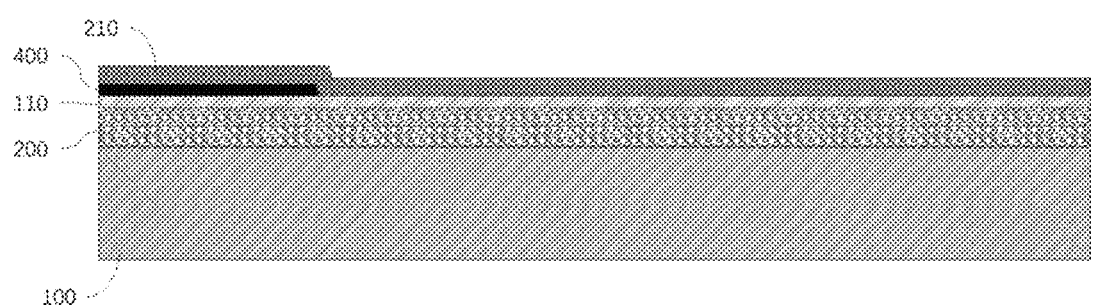
FIG. 5 is a structural view for step 3 of a fabrication method of an electrode structure of a resonator according to the present invention.

Step 3, as shown in FIG. 5, a top electrode protrusion/frame metal layer 210a is deposited. The top electrode protrusion/frame metal layer 210a is made of a conductive material, which may be the same as the material of the top electrode metal layer 200a of the top electrode, or may be different from the material of the top electrode metal layer 200a.

Figure 6:
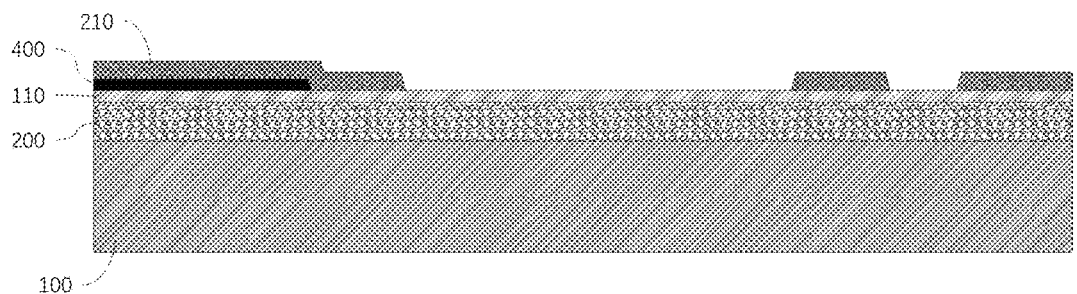
FIG. 6 is a structural view for step 4 of a fabrication method of an electrode structure of a resonator according to the present invention.

Step 4, as shown in FIG. 6, pattern etching is performed on the top electrode protrusion/frame metal layer 210a at the electrode edge until the top electrode dielectric layer 110a. The etching process may be one or a combination of two of a typical plasma etching process and a wet chemical etching process.

Figure 7:
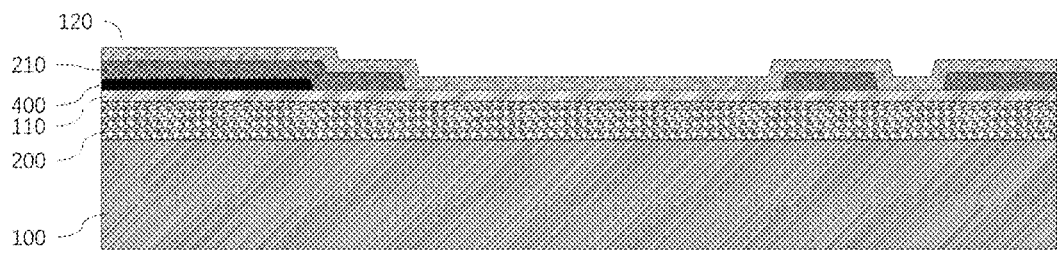
FIG. 7 is a structural view for step 5 of a fabrication method of an electrode structure of a resonator according to the present invention.

Step 5, as shown in FIG. 7, a top electrode etching passivation layer 120a is deposited. The top electrode etching passivation layer 120a may be made of silicon nitride (SiN), aluminum nitride (AlN), silicon oxide ($SiO_2$) and silicon oxynitride (SiNO), or a stack thereof.

Figure 8:
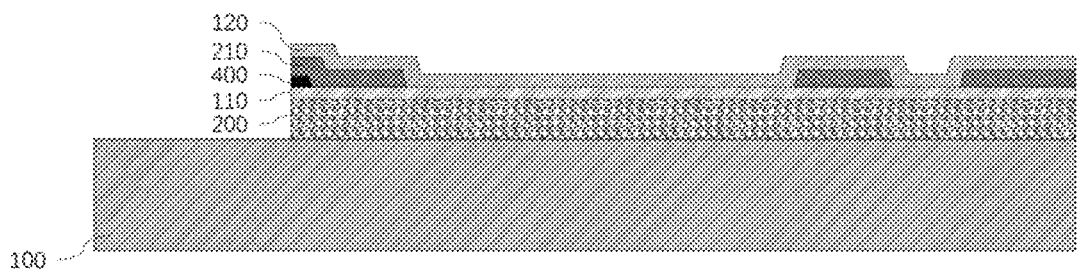
FIG. 8 is a structural view for step 6 of a fabrication method of an electrode structure of a resonator according to the present invention.

Step 6, as shown in FIG. 8, pattern etching is performed on the top electrode etching passivation layer 120a, the top electrode protrusion/frame metal layer 210a, the electrode edge sacrificial layer 400, the dielectric layer 110a and the top electrode metal layer 200a in sequence to form a structure of the top electrode of an FBAR. The etching process may be one or a combination of two of a typical plasma etching process and a wet chemical etching process.

Figure 9:
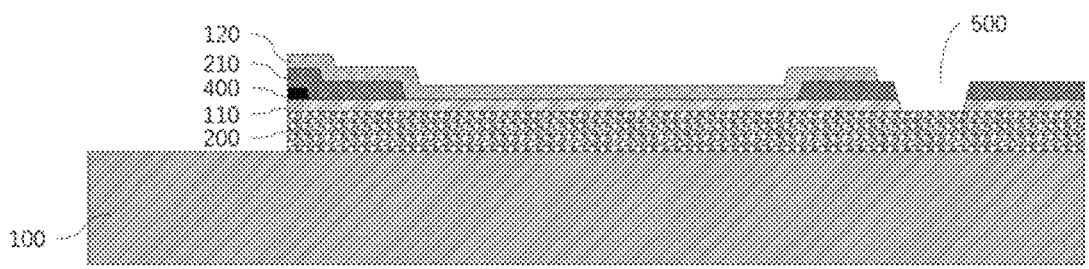
FIG. 9 is a structural view for step 7 of a fabrication method of an electrode structure of a resonator according to the present invention.

Step 7, as shown in FIG. 9, pattern etching is performed on the top electrode etching passivation layer 120a and the top electrode dielectric layer 110a from one side to form a top electrode conductive hole 500a in the top electrode metal layer 200a of the top electrode of the FBAR. The etching process may be one or a combination of two of a typical plasma etching process and a wet chemical etching process.

Figure 10:
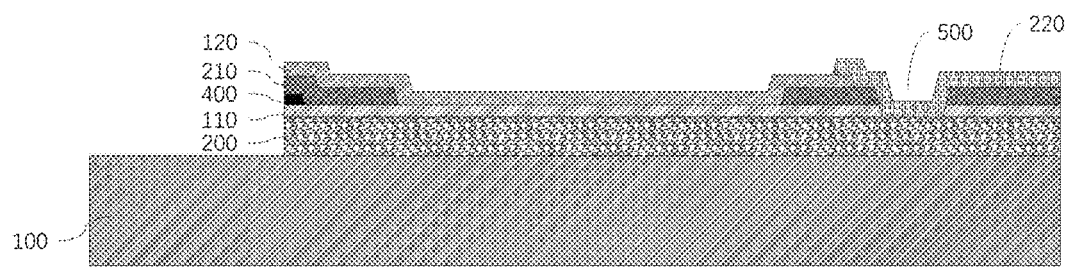
FIG. 10 is a structural view for step 8 of a fabrication method of an electrode structure of a resonator according to the present invention.

Step 8, as shown in FIG. 10, a top electrode metal lead 220a of the top electrode of the FBAR is formed. The top electrode conductive metal lead 220a includes a circuit lead and a pad, and the top electrode conductive metal lead 220a is connected to the top electrode metal layer 200a and the top electrode protrusion/frame metal layer 210a. The circuit lead and the pad may be made of a common metal, for example, aluminum (Al), copper (Cu), gold (Au), titanium (Ti), tungsten (W), platinum (Pt), or a stack thereof.

Figure 11:
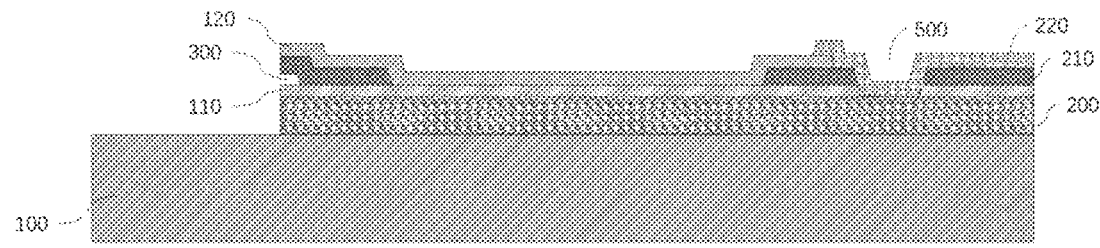
FIG. 11 is a structural view for step 9 of a fabrication method of an electrode structure of a resonator according to the present invention.
Figure 12:
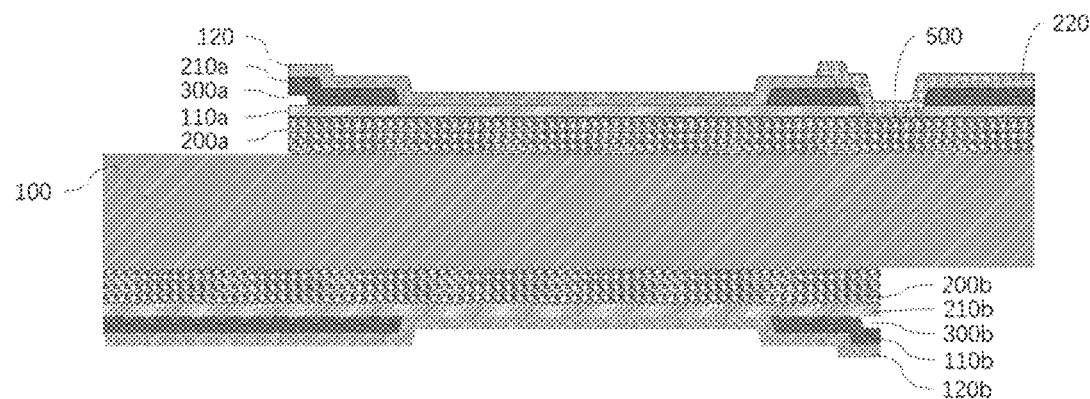
FIG. 12 is a structural view for an electrode structure of a resonator according to another embodiment of the present invention.

Step 9, as shown in FIG. 11, the electrode edge sacrificial layer 400 is release-etched to form the top electrode air gap 300a. In this embodiment, the electrode edge sacrificial layer 400 is made of silicon oxide ($SiO_2$). The release-etching process of the electrode edge sacrificial layer 400 is one or a combination of a plurality of HF wet etching, BOE wet etching and HF vapor etching.

Embodiment 2

This embodiment provides a fabrication method of a resonator with an air gap structure in a bottom electrode, which is suitable for an electrode structure of a resonator. As shown in FIGS. 2 to 12, this method includes the following steps:

Step 1, a bottom electrode metal layer 200b and a bottom electrode dielectric layer 110b are deposited on a piezoelectric layer 100. The piezoelectric layer 100 may be made of silicon nitride (SiN), aluminum nitride (AlN), silicon oxide ($SiO_2$) and silicon oxynitride (SiNO), or a stack thereof.

The bottom electrode metal layer 200b may be made of any suitable conductive metal material, for example, molybdenum (Mo), aluminum (Al), copper (Cu), platinum (Pt), tantalum (Ta), tungsten (W), palladium (Pd), ruthenium (Ru), or a stack thereof. In this embodiment, it is made of molybdenum (Mo).

The piezoelectric layer 100 may be made of a piezoelectric material, for example, aluminum nitride (AlN), zinc oxide (ZnO), lithium niobate ($LiNbO_3$), lithium tantalate ($LiTaO_3$), lead zirconate titanate (PZT) and barium strontium titanate (BST), or a stack thereof.

When the piezoelectric layer 100 is made of aluminum nitride (AlN), the aluminum nitride may further be doped with a certain ratio of rare earth element (for example, scandium, erbium, lanthanum, etc.).

In this embodiment, the piezoelectric layer 100 is made of aluminum nitride (AlN) or scandium doped aluminum nitride (SLAlN).

Step 2, during the fabrication of the bottom electrode, an electrode edge sacrificial layer 400 of the resonator for pattern etching is formed above the bottom electrode metal layer 200b. The electrode edge sacrificial layer 400 is removed in a subsequence process to form a bottom electrode air gap 300b. The electrode edge sacrificial layer 400 for pattern etching may be formed through a lift-off process or pattern etching.

Step 3, as shown in FIG. 5, a bottom electrode protrusion/frame metal layer 210b is deposited. The bottom electrode protrusion/frame metal layer 210b is made of a conductive material, which may be the same as the material of the bottom electrode metal layer 200b of the bottom electrode, or may be different from the material of the bottom electrode metal layer 200b.

Step 4, pattern etching is performed on the bottom electrode protrusion/frame metal layer 210b at the electrode edge until the bottom electrode dielectric layer 110b. The etching process may be one or a combination of two of a typical plasma etching process and a wet chemical etching process.

Step 5, a bottom electrode etching passivation layer 120b is deposited. The bottom electrode etching passivation layer 120b may be made of silicon nitride (SiN), aluminum nitride (AlN), silicon oxide ($SiO_2$) and silicon oxynitride (SiNO), or a stack thereof.

Step 6, pattern etching is performed on the bottom electrode etching passivation layer 120b, the bottom electrode protrusion/frame metal layer 210b, the electrode edge sacrificial layer 400, the dielectric layer 110b and the bottom electrode metal layer 200b in sequence to form a structure of a bottom electrode of an FBAR. The etching process may be one or a combination of two of a typical plasma etching process and a wet chemical etching process.

Step 7, pattern etching is performed on the bottom electrode etching passivation layer 120b and the bottom electrode dielectric layer 110b from one side to form a bottom electrode conductive hole 500b in the bottom electrode metal layer 200b of the bottom electrode of the FBAR. The etching process may be one or a combination of two of a typical plasma etching process and a wet chemical etching process.

Step 8, a bottom electrode metal lead 220b of the bottom electrode of the FBAR is formed. The bottom electrode conductive metal lead 220b includes a circuit lead and a pad, and the bottom electrode conductive metal lead 220b is connected to the bottom electrode metal layer 200b and the bottom electrode protrusion/frame metal layer 210b. The circuit lead and the pad may be made of a common metal, for example, aluminum (Al), copper (Cu), gold (Au), titanium (Ti), tungsten (W), platinum (Pt), or a stack thereof.

Step 9, the electrode edge sacrificial layer 400 is release-etched to form the bottom electrode air gap 300b. In this embodiment, the electrode edge sacrificial layer 400 is made of silicon oxide ($SiO_2$). The release-etching process of the electrode edge sacrificial layer 400 is one or a combination of a plurality of HF wet etching, BOE wet etching and HF vapor etching.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. An electrode structure of a resonator, comprising:
    a piezoelectric layer;
    an electrode metal layer arranged above the piezoelectric layer;
    a dielectric layer arranged above the electrode metal layer;
    a protrusion/frame metal layer arranged above the dielectric layer; and
    an etching passivation layer arranged above the protrusion/frame metal layer;
    wherein an air gap is formed between the dielectric layer and the protrusion/frame metal layer, and the air gap is located at an electrode edge.

2. The electrode structure according to claim 1, wherein a first side of the protrusion/frame metal layer is provided with a protrusion structure, wherein the first side of the protrusion/frame metal layer adjacent to the dielectric layer, and the protrusion structure protrudes upwardly; and
    the air gap is formed between the protrusion structure and the dielectric layer.

3. The electrode structure according to claim 1, further comprising: a conductive metal lead, wherein
    the conductive metal lead is located on a second side of the protrusion/frame metal layer, wherein the second side of the protrusion/frame metal layer is away from the dielectric layer.

4. The electrode structure according to claim 1, wherein an end of the etching passivation layer is provided with a conductive hole, wherein the end of the etching passivation layer is away from the air gap;
    a conductive metal lead is provided in the conductive hole and extends outward; and
    the conductive metal lead is electrically connected to the electrode metal layer and the protrusion/frame metal layer, respectively.

5. A fabrication method of the electrode structure of the resonator according to claim 1, and the fabrication method comprises the following steps:
    step 1: depositing the electrode metal layer and the dielectric layer on the piezoelectric layer in sequence;
    step 2: forming an electrode edge sacrificial layer of the resonator for a pattern etching above the electrode metal layer;
    step 3: depositing the protrusion/frame metal layer above the electrode metal layer and on the electrode edge sacrificial layer;
    step 4: performing the pattern etching on the protrusion/frame metal layer at the electrode edge until the dielectric layer;
    step 5: depositing the etching passivation layer on a surface of the protrusion/frame metal layer;
    step 6: performing the pattern etching on a first side of the etching passivation layer, a first side of the protrusion/frame metal layer, a first side of the electrode edge sacrificial layer, a first side of the dielectric layer and a first side of the electrode metal layer at the electrode edge in sequence to form a structure of a top electrode of a film bulk acoustic resonator (FBAR);
    step 7: performing the pattern etching on a second side of the etching passivation layer and a second side of the dielectric layer to form a conductive hole of the top electrode of the FBAR;
    step 8: forming a conductive metal lead of the top electrode of the FBAR, wherein the conductive metal lead is electrically connected to the electrode metal layer and the protrusion/frame metal layer, respectively; and step 9: release-etching the electrode edge sacrificial layer to form the air gap.

6. The fabrication method according to claim 5, wherein
in step 1, the dielectric layer comprises one, or a stack of at least two, selected from the group consisting of silicon nitride, aluminum nitride, silicon oxide and silicon oxynitride;
the electrode metal layer is made of a metal material or a conductive metal material;
the metal material or the conductive metal material comprises one, or a stack of at least two, selected from the group consisting of molybdenum, aluminum, copper, platinum, tantalum, tungsten, palladium and ruthenium;
the piezoelectric layer is made of a piezoelectric material, and the piezoelectric material comprises one, or a stack of at least two, selected from the group consisting of aluminum nitride, zinc oxide, lithium niobate, lithium tantalate, lead zirconate titanate and barium strontium titanate;
in step 2, the electrode edge sacrificial layer is removed to form the air gap; and the electrode edge sacrificial layer is formed above the electrode metal layer of the top electrode by a lift-off process or the pattern etching;
in step 3, the protrusion/frame metal layer is made of a conductive material; and
in step 5, the etching passivation layer comprises one, or a stack of at least two, selected from the group consisting of silicon nitride, aluminum nitride, silicon oxide and silicon oxynitride.

7. The fabrication method according to claim 6, wherein
when the piezoelectric material of the piezoelectric layer is aluminum nitride, the piezoelectric material is further doped with a rare earth element; and
the rare earth element comprises one, or a combination of at least two, selected from the group consisting of scandium, erbium and lanthanum.

8. The fabrication method according to claim 5, wherein
in steps 4, 6 and 7, the pattern etching is one, or a combination of two, selected from the group consisting of plasma etching and wet chemical etching.

9. The fabrication method according to claim 5, wherein
the conductive metal lead defines a circuit lead and a pad of the top electrode of the FBAR; and
the conductive metal lead is made of a metal material, wherein the metal material comprises one, or a stack of at least two, selected from the group consisting of aluminum, copper, gold, titanium, tungsten and platinum.

10. The fabrication method according to claim 5, wherein
the electrode edge sacrificial layer is made of silicon oxide; and
in step 9, the release-etching process is one, or a combination of at least two, selected from the group consisting of hydrofluoric acid (HF) wet etching, buffered oxide etchant (BOE) wet etching and HF vapor etching.

11. The fabrication method according to claim 5, wherein
a first side of the protrusion/frame metal layer is provided with a protrusion structure, wherein the first side of the protrusion/frame metal layer adjacent to the dielectric layer, and the protrusion structure protrudes upwardly; and
the air gap is formed between the protrusion structure and the dielectric layer.

12. The fabrication method according to claim 5, wherein
the electrode structure further comprises a conductive metal lead, wherein
the conductive metal lead is located on a second side of the protrusion/frame metal layer, wherein the second side of the protrusion/frame metal layer is away from the dielectric layer.

13. The fabrication method according to claim 5, wherein
an end of the etching passivation layer is provided with a conductive hole, wherein the end of the etching passivation layer is away from the air gap;
a conductive metal lead is provided in the conductive hole and extends outward; and
the conductive metal lead is electrically connected to the electrode metal layer and the protrusion/frame metal layer, respectively.

\* \* \* \* \*